(12) United States Patent
Pan et al.

(10) Patent No.: US 6,961,280 B1
(45) Date of Patent: Nov. 1, 2005

(54) TECHNIQUES FOR IMPLEMENTING ADDRESS RECYCLING IN MEMORY CIRCUITS

(75) Inventors: Philip Pan, Fremont, CA (US);
Chiakang Sung, Milpitas, CA (US);
Joseph Huang, San Jose, CA (US);
Yan Chong, San Jose, CA (US);
Johnson Tan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 80 days.

(21) Appl. No.: 10/731,279

(22) Filed: Dec. 8, 2003

(51) Int. Cl.[7] .............................................. G11C 8/00
(52) U.S. Cl. ........................ 365/230.02; 365/230.01; 365/230.08; 711/3; 711/211
(58) Field of Search ...................... 365/230.01, 230.02, 365/230.08; 711/3, 211

(56) References Cited

U.S. PATENT DOCUMENTS

| | | | |
|---|---|---|---|
| 4,034,349 A | 7/1977 | Monaco et al. |
| 4,742,452 A | 5/1988 | Hirokawa |
| 4,920,539 A | 4/1990 | Albonesi |
| 5,222,223 A | 6/1993 | Webb, Jr. et al. |
| 5,329,629 A | 7/1994 | Horst et al. |
| 5,594,885 A | 1/1997 | Lautzenheiser |
| 5,721,857 A | 2/1998 | Glew et al. |
| 5,742,831 A | 4/1998 | Creta |
| 5,802,555 A | 9/1998 | Shigeeda |
| 5,809,528 A | 9/1998 | Miller et al. |
| 6,185,630 B1 | 2/2001 | Simmons |
| 6,279,083 B1 | 8/2001 | MacDonald |
| 6,378,023 B1 | 4/2002 | Christie et al. |
| 6,499,078 B1 | 12/2002 | Beckert et al. |
| 6,519,187 B2 | 2/2003 | Wada |
| 6,665,767 B1 * | 12/2003 | Comisky et al. ............... 711/3 |

* cited by examiner

Primary Examiner—VanThu Nguyen
(74) Attorney, Agent, or Firm—Townsend and Townsend and Crew LLP

(57) ABSTRACT

Techniques are provided for recycling addresses in memory blocks. Address signals in memory blocks are stored temporarily in a set of parallel coupled address registers. The address registers transfer the address signals to an address decoder block, which decodes the address signals. The address decoder block transfers the decoded addresses to a memory array. A stall state occurs when the cache memory block needs a new set of data to replace the old set of data. Address signals are stored in the address registers during the stall state by coupling each register's output to its data input using a series of multiplexers. The multiplexers are controlled by an address stall signal that indicates the onset and the end of a stall state. After the end of a stall state, the address registers store the next address signal received at the memory block.

19 Claims, 5 Drawing Sheets

TECHNIQUES FOR IMPLEMENTING ADDRESS RECYCLING IN MEMORY CIRCUITS

BACKGROUND OF THE INVENTION

The present invention relates to techniques for recycling address signals for a memory circuit, and more particularly, to techniques for storing an address signal for a memory circuit during a stall cycle for subsequent use.

In most systems on a chip (SOC) designs, a sequential machine such as a microprocessor or a microcontroller plays a central role in distributing signals through the SOC. A sequential machine requires a sharable memory or two separated memories to store and to load instructions and data.

The majority of a computer system's operations are spent performing memory load and store functions. For this reason, efforts have been made to reduce both memory access time within a clock cycle and the latency of memory data flow to improve the overall performance of computer systems.

On such solution involves cache memory architecture. In cache memory architecture, embedded memory and control logic units are placed together on the same silicon chip to shorten the memory access time between separated stand-alone chips. Cache memory architecture also reduces the latency of memory clock cycles. However, some types of cache memories do not offer all of these benefits.

Sometimes the system control logic uses a virtual memory addressing scheme. In other instances, the physical size of the cache memory does not match the size of a logical address. In these situations, the cache memory has to collaborate with extra circuitry and other small memories to form a memory management unit (MMU).

The control logic of the MMU schedules different latency times of clock cycles for various cache operations depending on individual needs. Sometimes the cache memory has to spend one or more additional clock cycles to finish a memory store or load data. The extra time required for the additional clock cycles eliminates the time savings provided by using cache memory in the first place.

Many types of SOC systems include programmable logic devices (PLDs). As the memory demands of SOC systems grow, the memory of PLDs also needs to be enhanced to meet the increased demands. As a result, an increased need is developing to improve latency access times for memories in PLDs and on SOC systems.

A typical dual-port static read access memory (SRAM) block on a PLD includes an SRAM core, two programmable input/output interfaces to programmable interconnect lines, two sets of data registers, two sets of control registers, and two sets of address registers. The address registers are controlled by a clock signal for signal synchronization. The SRAM core includes a memory array and address decoder circuitry.

Address signals are transmitted from through the programmable interconnect to an SRAM block through configurable multiplexers and driver circuits. The address signals are stored temporarily in the address registers. The address registers store a new address signal at each rising edge of the clock signal. The address decoder circuitry decodes each address signal and uses the decoded address signals to select word lines in the SRAM memory array to access data stored at the decoded addresses.

When an SRAM block in a PLD is used by an MMU as a cache memory, data is read from the cache memory in data blocks. When an entire block of data has been read from the cache memory, a new block of data is stored in the cache. A stall state is initiated when the data stored within the SRAM cache memory is refreshed with a new set of data. During the stall state, the read port address might be changed and irrelevant to the cache memory for supporting different block in the system. Because the address signals cannot be used to access data in the memory cache during the stall state, address signals that were transmitted to the memory cache immediately before the start of the stall state are lost.

When the stall state ends, the memory block has to reload address signals lost prior to the stall state. It takes additional time and clock cycles to reload these address signal, significantly slowing down overall memory access time. Therefore, there is a need to provide techniques for recycling address signals in memory circuits during a stall state that minimizes read access latency delays.

BRIEF SUMMARY OF THE INVENTION

The present invention provides techniques for recycling addresses in memory circuit blocks. According to the present invention, address signals in memory blocks are stored temporarily in a set of parallel coupled address registers. The address registers transfer the address signals to an address decoder block, which decodes the address signals. The address decoder block selects world lines in the memory array using the decoded addresses.

A stall state occurs when the cache memory block needs a new set of data to replace an old set of data. A recycle address is stored in the address registers during the stall state by coupling each register's output back to its data input using a series of multiplexers. The multiplexers are controlled by an address stall signal that indicates the onset and the end of a stall state. At the end of a stall state, a new set of data can be immediately read from the cache memory block at the recycle address, and the input address registers are ready to receive the next address signal.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
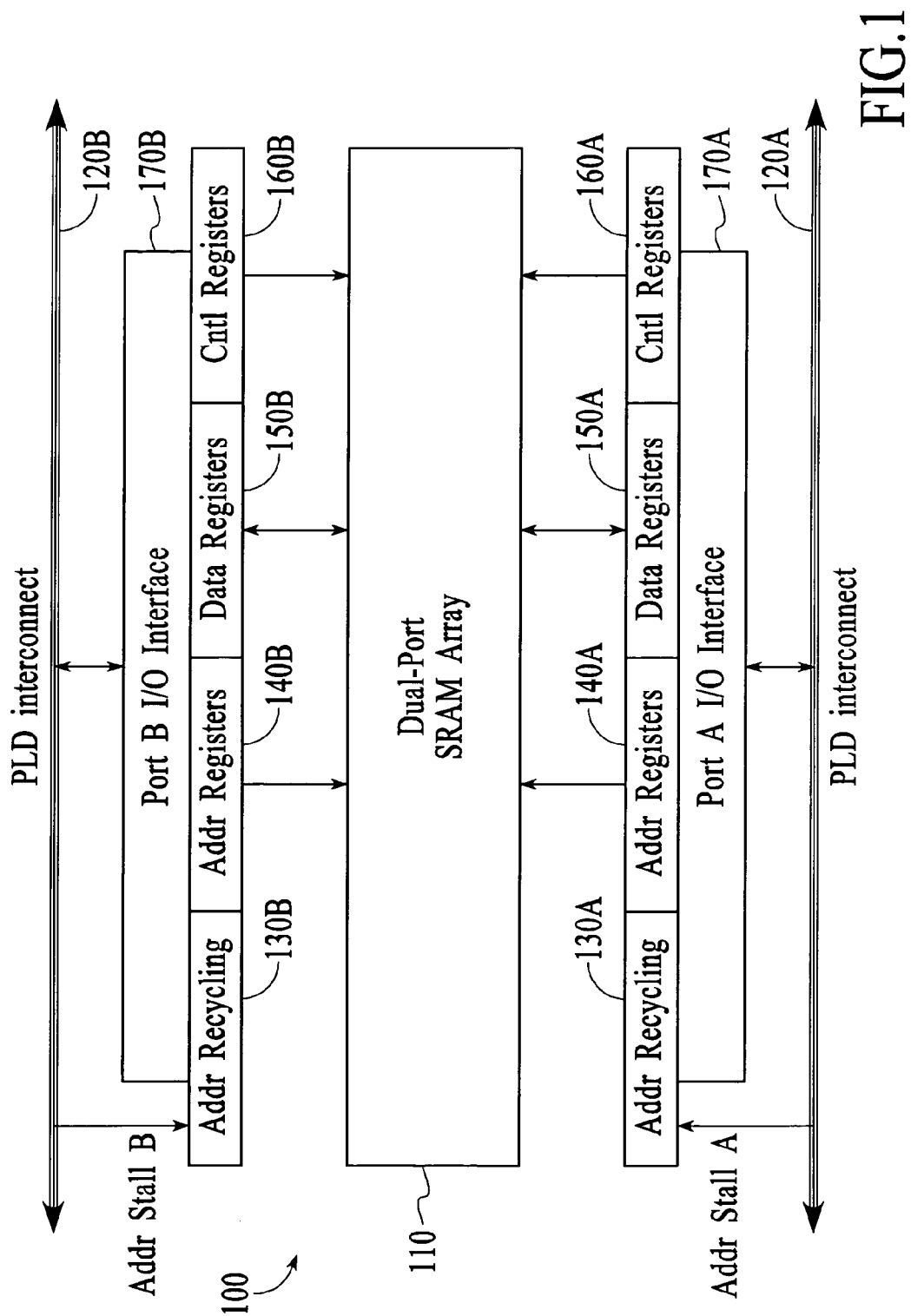
FIG. 1 is a block diagram of a dual-port memory block, interface circuitry, registers, and address recycling circuitry according to an embodiment of the present invention.

FIG. 1 illustrates a memory block 100 according to an embodiment of the present invention. Memory block 100 is a circuit block within a programmable integrated circuit.

Programmable integrated circuits includes field programmable gate arrays (FPGAs), programmable logic devices (PLDs), configurable logic arrays, programmable logic arrays, etc. The techniques of the present invention also apply to memory blocks circuits within application specific integrated circuits (ASICs).

Memory block 100 includes an array of SRAM memory cells 110. Array 110 is a dual-port array that can send and receive data through two I/O ports A and B. Typically, data is read from memory array 110 through one of the I/O ports, and data is written to array 110 through the second I/O port. For example, data can be written to array 110 from PLD interconnect lines 120A through port A I/O interface 170A, and data can be read from array 110 and transmitted to PLD interconnect lines 120B through port B I/O interface 170B.

Dual-port memory block 100 also includes two address recycling circuits 130A and 130B, address registers 140A and 140B, data registers 150A and 150B, and control registers 160A and 160B. Data signals are transmitted to and from memory block 110 through PLD interconnect lines 120A/120B. Data registers 150A/150B temporarily store data signals that are transmitted between array 110 and PLD interconnect lines 120A/120B. Control registers 160A/160B temporarily store control signals from PLD interconnect lines 120A/120B before they are transmitted to array 110.

Memory address signals are also transmitted through PLD interconnect lines 120A/120B to memory array 110. The address signals are temporarily stored in address registers 140A/140B. During a stall state, an address stall signal is sent to address recycling circuits 130A/130B.

The address stall signal can be generated by a programmable logic block within the PLD. The programmable logic block can be programmed to monitor memory array 110. When any data in memory array 110 has to be replaced, memory 110 is refilled with new data, and the programmable logic block causes the address stall signal to change state. After memory array 110 is refilled with new data, the programmable logic block causes the address stall signal to return to its original state. Alternatively, the address stall signal can be generated by circuitry external to the PLD.

In response to the address stall signal, address recycling circuits 130A/130B cause address registers 140A/140B to store the current address signal until the end of the stall state. Further details of address recycling circuits 130A/130B are now discussed.

Figure 2:
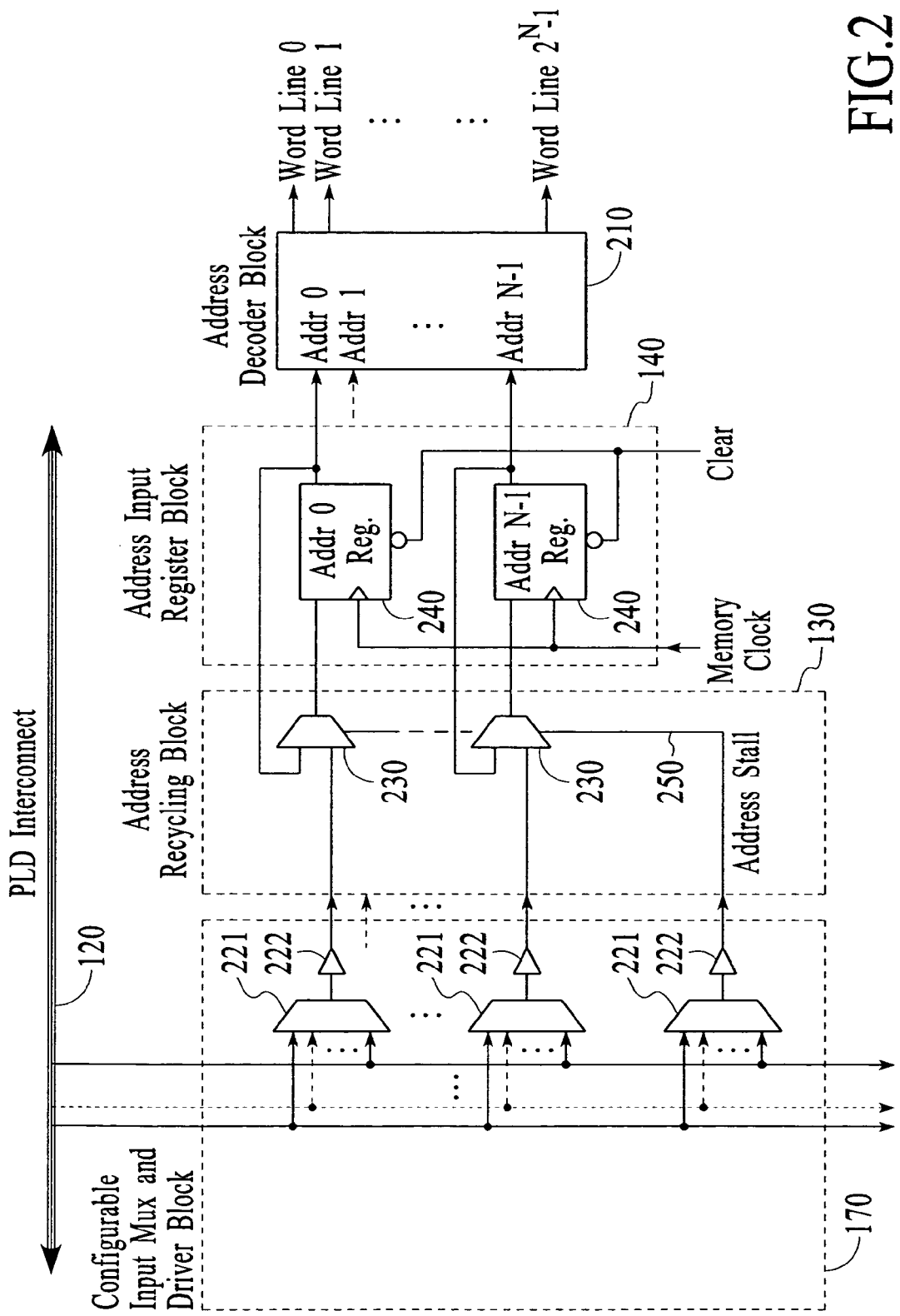
FIG. 2 illustrates further details of address recycling circuitry for a memory block according to an embodiment of the present invention.

FIG. 2 illustrates portions of memory block 110 including I/O interface 170, address recycling circuit 130, address register block 140, and address decoder circuit 210. Input/output (I/O) interface circuit 170 includes several programmable multiplexers 221 and drivers 222. Multiplexers 221 selectively couple PLD interconnect lines 120 to address recycling circuit 130 through drivers 222. Multiplexers 221 are programmed by signals not shown in FIG. 2. Drivers 222 buffer input signals transmitted to address recycling circuit 130.

Address recycling circuit 130 includes several 2-to-1 multiplexers 230. The multiplexers are coupled between I/O interface 170 and address register block 140. Address register block 140 include several address registers 240. Address registers 240 are coupled in parallel between multiplexers 230 and address decoder block 210.

Each of multiplexers 230 has two input terminals. Each of the first input terminals is coupled to I/O interface circuit 170. Each of the second input terminals is coupled to the output terminal of one of address registers 240. Each of the output terminals of multiplexers 230 is coupled to a data input of one of address registers 240.

Multiplexers 230 each have a select input terminal that is coupled to receive an address stall signal on signal line 250 as shown in FIG. 2. The address stall signal is a signal that indicates when the memory array 110 enters a stall state. The stall signal can be generated in a programmable logic block on the PLD or from a source external to the integrated circuit. The stall signal is transmitted to memory block 100 through interconnect 120 and coupled to each of multiplexers 230 through a multiplexer 223 in I/O interface circuit 170.

The operation of the present invention is now discussed in detail. Data is transmitted to memory array 110 through data registers 150A/150B as discussed above. Address signals are needed to identify where in array 110 data is stored during a memory write cycle or accessed during a memory read cycle.

Address signals are transmitted to memory block 100 through PLD interconnect 120. I/O interface block 170 programmably couples multiplexers 221 to transmit the address signals from interconnect 120 into block 100. If a stall state is not occurring, multiplexers 230 in address recycling block 130 couple I/O interface 170 to data inputs of address registers 240. The address signals are transmitted from I/O interface 170 through multiplexers 230 to address registers 240.

Each of address registers 240 has a clock input terminal that is coupled to receive a memory clock signal. The clock signal controls the shifting of address signals through address registers 240. At the rising edge of each clock signal, each register 240 transmits the signal at its data input terminal to its output terminal. According to various embodiments of the present invention, the data input terminal of each register 240 is decoupled from its output terminal by the rising or falling edges of the clock signal or the state (HIGH or LOW) of the clock signal, depending on the type of register.

Each address register 240 also has a clear input coupled to receive a clear signal. On the rising edge of the clear signal, the output signals of registers 240 become LOW. Register 240 implements an active-at-low clear signal, which can also replaced by an active-at-high clear signal in other embodiments of the present invention.

The address signals stored at the output terminals of address registers 240 are transmitted to address decoder block 210. Address decoder block 210 decodes the address signals from an N-bit binary number into a set of $2^N$ signals that select one of the word lines in the memory array 110. Memory array 110 is arranged into rows of word lines and columns of bits lines. Address decoder block 210 decodes the address signals using well-known address decoding techniques.

Memory block 100 can be used by an MMU as a cache memory. The dual-port SRAM Array 110 is typically assigned to have one port for read and another port for write (e.g. Port A for read and Port B for write or vice versa). When the data stored in SRAM memory block 100 needs to be refilled with a new set of data, a stall state occurs and sends address stall signal 250 to the address recycling block 130 of the read port. During a stall state, the new set of data is written to SRAM memory block 100 by using a well-known memory write operation through the write port. No new address is received at the input terminal of address registers 240. During the stall state, the programmable logic block may continue to transmit address signals to block 100.

When the stall state commences, the address stall signal on signal line 250 changes state (e.g., goes HIGH). In response to the stall signal changing state, multiplexers 230 each couple their second input terminal to their output terminal. The output terminal of each address register 240 is now coupled to its data input terminal through one of multiplexers 230.

Thus, multiplexers 230 couple a feedback loop around address registers 240 during the stall state. The feedback loops formed by multiplexers 230 allow address registers 240 to store the current (recycle) address signals during the stall state. Even after any changes in the state of the clock signal, address registers 240 maintain the current (recycle) address signal during the stall state.

The first input terminals of multiplexers 230 are decoupled from the output terminals of multiplexers 230 during the stall state. Address signals received at I/O interface 170 during the stall state are not stored in memory block 100.

After the stall state, the stall signal returns to its original value, and multiplexers 230 again couple I/O interface block 170 to address registers 240. The new data stored at the recycle address prior to the stall state can be immediately read at the output of the cache memory block 100, because the recycle address was stored in registers 240 during the stall state.

The input address registers 240 are ready to receive new address signals after the stall state. Address signals received at I/O interface 170 following the stall state are stored in address registers 240 at the next rising clock edge, and transmitted to address decoder block 210.

Figure 3:
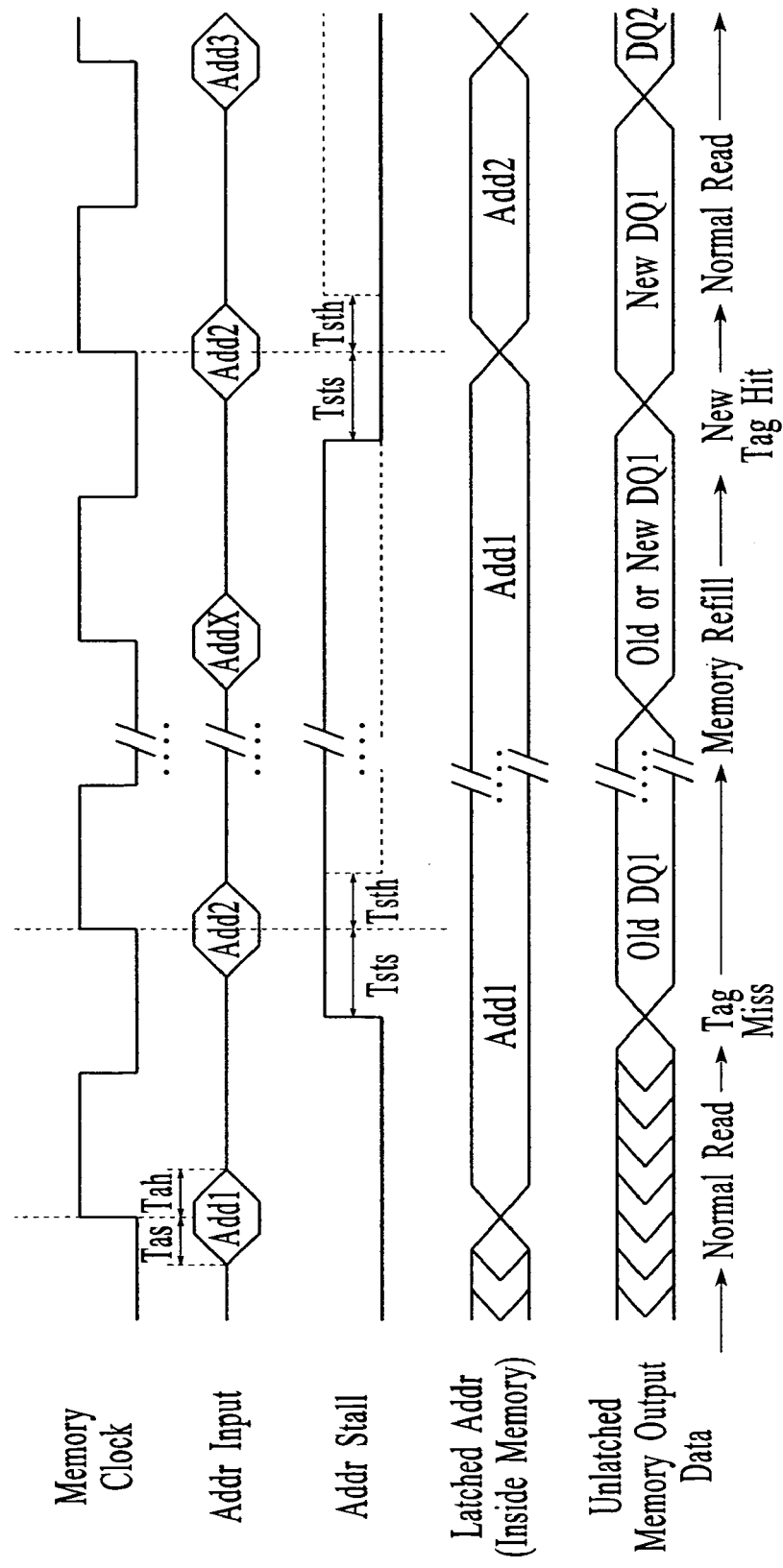
FIG. 3 is a timing diagram that illustrates signals associated with the operation of the address recycling circuitry of FIG. 2 according to the present invention.

Thus, the present invention provides address recycling circuitry that can store memory address signals during a stall state so that the memory address signals can be reused following the stall state during a subsequent load or read instruction. FIG. 3 is a timing diagram that illustrates examples of signals used during the operation of the address circuitry of FIG. 2.

FIG. 3 illustrates examples of the memory clock signal, the input address signals, the address stall signal, the address signals latched in address registers 240, and the unlatched memory output data from memory array 110. Initially, the address stall signal is LOW, because array 110 is not in a stall state. On the first rising edge of the memory clock signal, the first address signal (add1) received at I/O interface 170 is latched into address registers 240. Data DQ1 is read from memory array 110 at address addr1.

Subsequently, a stall state begins, and a tag comparator (not shown) asserts a tag miss signal. Then, the address stall signal goes HIGH, causing multiplexers 230 to change state. Multiplexers 230 couple the output terminals of registers 240 to their data input terminals. During the stall state, the address registers 240 store the address signal add1 as shown by the latched address signal in FIG. 3. The next address signal add2 and subsequent addresses are not stored in address registers 240.

The contents of memory array 110 is refilled with new data during the stall state. After the stall state, a new set of data is available in memory array 110. The decoded address signal add1 is used to select a word line in array 110, and new data DQ1 is read from the row selected by address add1 whenever its storage cell receives new data from the write port during the refill process. The data DQ2, which is from the next new address signal add2, is also the new data stored in memory array 110 during the previous stall state.

The techniques of the present invention allow updated data stored at an address received before the stall state (e.g., add1) to be immediately read out of memory array 110 before the read address stall signal goes LOW again. Because a previously sent address signal (e.g., add1) is stored during the stall state by recycle circuit 130 for use at a later time, the memory access latency time is faster for all memory operations in the computer system. The increased speed enhances the implementation of a PLD in an SOC system.

After the stall state ends, the programmable logic block causes the address stall signal to go LOW. On the falling edge of the address stall signal, multiplexers 230 change state to couple interface 170 to address registers 240, and address registers 240 release address signal add 1. The next input address signal add2 is sent to memory block 100 a second time after the stall state.

On the next rising edge of the memory clock signal, address registers 240 latch address signal add2, as shown in FIG. 2. Address signal add2 is then sent to address decoder block 210, which decodes add2. The decoded address selects a word line in memory array 110, and memory array 110 outputs data DQ2, which is stored at address add2.

More data is read from memory array 110 in the same manner as described above, until memory refill is needed. During each memory refill process, the address stall signal goes HIGH to store the current address signal in address registers 240, so that this address signal is not lost.

The techniques of the present invention provide for a more efficient way for data to be read from cache memory after each data refill cycle. Because the last address sent to memory block 100 before the stall state is stored in address registers 240 by the address recycle circuits 230, the address generation circuitry does not need to resend the last address signal. This technique saves precious clock cycles and speeds up data access latency delays for cache memory.

The address recycle multiplexers 230 do not increase the gate delay on the critical path of the address signals. The critical path of the address signals is from address registers 240 to the word lines of the memory array 110.

In memory block 100, there is no need to gate the memory clock signal during the stall state, because registers 240 store the address signals regardless of the state of the clock signal. This feature is advantageous, because gating the clock signal can cause glitches on the clock signal and possibly data contention. In the present invention, the memory clock signal can move on the same pipeline pace of the system.

By using the techniques of the present invention, there is no need to use extra logic blocks and routing resources outside of memory block 110 to build expensive address storage circuitry on the PLD. Instead, the present invention stores the address signal received before the start of the stall state by providing a much smaller amount of added circuitry within memory block 110. The additional circuitry includes the recycle circuit block 130 and the circuitry that routes and drives the address stall signal.

Figure 4:
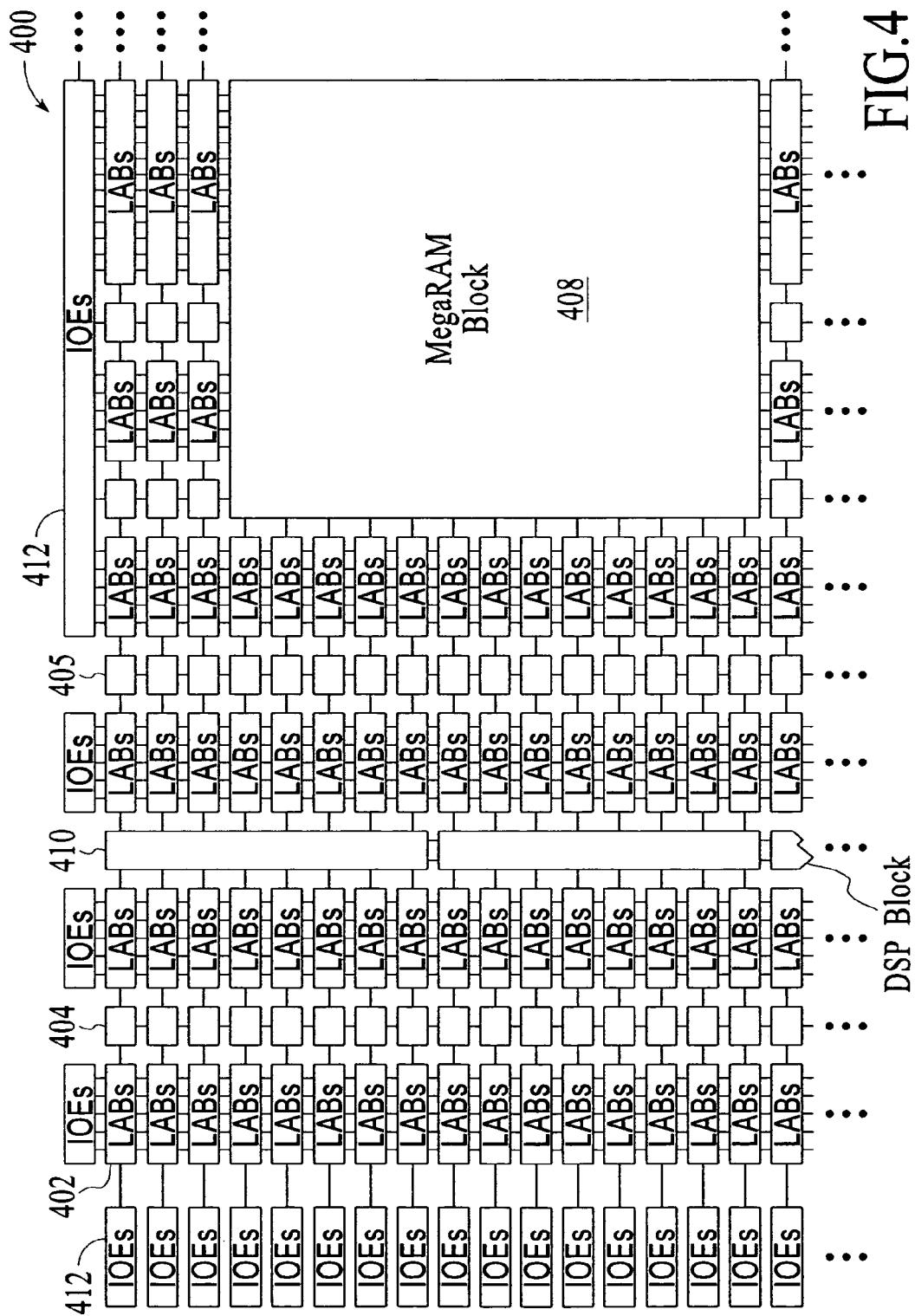
FIG. 4 is a simplified block diagram of a programmable logic device that can implement embodiments of the present invention.

FIG. 4 is a simplified partial block diagram of an exemplary high-density PLD 400 wherein techniques of the present invention can be utilized. PLD 400 includes a two-dimensional array of programmable logic array blocks (or LABs) 402 that are interconnected by a network of column and row interconnects of varying length and speed. LABs 402 include multiple (e.g., 10) logic elements (or LEs). An LE is a programmable logic block that provides for efficient implementation of user defined logic functions.

PLD 400 also includes a distributed memory structure including RAM blocks of varying sizes provided throughout the array. The RAM blocks include, for example, 512 bit blocks 404, 4K blocks 406 and a MegaBlock 408 providing 512K bits of RAM. These memory blocks can also include shift registers and FIFO buffers. PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
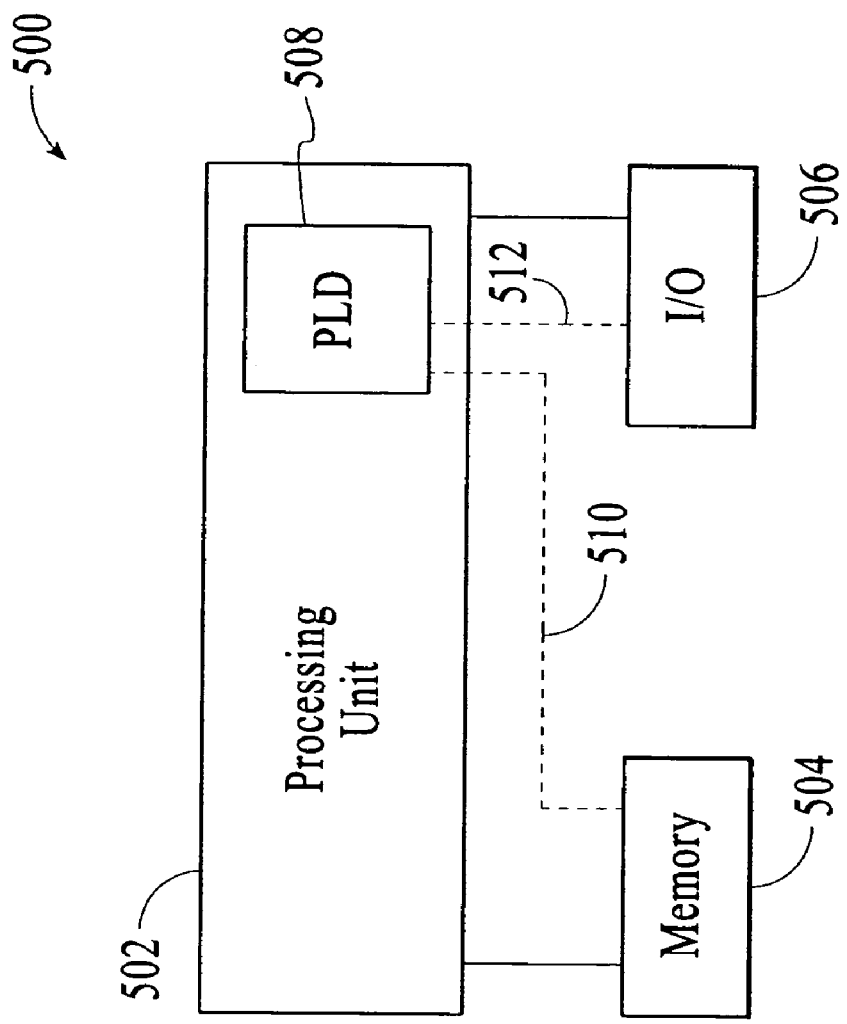
FIG. 5 is a block diagram of an electronic system that can implement embodiments of the present invention.

While PLDs of the type shown in FIG. 4 provide many of the resources required to implement system level solutions, the present invention can also benefit systems wherein a PLD is one of several components. FIG. 5 shows a block diagram of an exemplary digital system 500, within which the present invention can be embodied. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 508 is embedded in processing unit 502. PLD 508 can serve many different purposes within the system in FIG. 5. PLD 508 can, for example, be a logical building block of processing unit 502, supporting its internal and external operations. PLD 508 is programmed to implement the logical functions necessary to carry on its particular role in system operation. PLD 508 can be specially coupled to memory 504 through connection 510 and to I/O unit 506 through connection 512.

Processing unit 502 can direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 508 can control the logical operations of the system. In an embodiment, PLD 508 acts as a reconfigurable processor, which can be reprogrammed as needed to handle a particular computing task. Alternately, programmable logic device 508 can itself include an embedded microprocessor. Memory unit 504 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable integrated circuit including a memory block, the memory block comprising:
   a plurality of address recycling multiplexers each having a first address input coupled to receive address signals, and a select input coupled to receive an address stall signal;
   a plurality of address registers each having a data input coupled to an output of a corresponding one of the address recycling multiplexers, and an output coupled to a second input of the corresponding one of the address recycling multiplexers; and
   an address decoder coupled to the outputs of the address registers.

2. The programmable integrated circuit of claim 1 wherein each of the address registers has a clock input coupled to receive a clock signal.

3. The programmable integrated circuit of claim 2 wherein the memory block further comprises:
   a second plurality of multiplexers configurable to couple programmable interconnect lines to the address recycling multiplexers.

4. The programmable integrated circuit of claim 1 wherein the memory block further comprises:
   an array of SRAM memory cells; and
   data registers coupled to receive data signals and to transmit the data signals to the array of memory cells.

5. The programmable integrated circuit of claim 1 wherein the programmable integrated circuit is a field programmable gate array that is part of a system on a chip.

6. A method for storing address signals during a stall state of a cache memory, the method comprising:
   providing address signals at first inputs of address recycling multiplexers;
   coupling the first inputs of the address recycling multiplexers to data inputs of address registers when an address stall signal is in a first state;
   providing the address signals to an address decoder;
   providing decoded address signals from the address decoder to the cache memory; and
   coupling output terminals of the address registers to second inputs of the address recycling multiplexers when the address signal is in a second state during a refresh of the cache memory.

7. The method of claim 6 wherein providing the address signals at the first inputs of the address recycling multiplexers further comprises:
   coupling interconnect lines to the first inputs of the address recycling multiplexers through second multiplexers.

8. The method of claim 6 wherein providing the address signals to an address decoder further comprises:
   transmitting each set of the address signals from the data inputs to the output terminals of the address registers in response to every other edge of a clock signal.

9. The method of claim 6 further comprising:
   generating the address stall signal in a programmable logic block in response to a refresh of the cache memory.

10. The method of claim 6 further comprising:
    providing data to the cache memory using data registers.

11. The method of claim 6 wherein the address multiplexer, the address registers, the address decoder and the cache memory all reside within a circuit block a programmable integrated circuit.

12. The method according to claim 11 wherein the programmable integrated circuit is part of a system on a chip.

13. A integrated circuit including a memory block, the memory block comprising:
an address decoder circuit block;
address registers coupled to inputs of the address decoder circuit block and coupled to receive a clock signal at clock inputs;
an address recycling block that causes the address registers to store address signals during multiple cycles of the clock signal when an address stall signal is in a first state,
wherein the address recycling block has first inputs coupled to receive the address signals, second inputs coupled to outputs of the address registers, a select input coupled to receive the address stall signal, and outputs coupled to data inputs of the address registers.

14. The integrated circuit as defined in claim 13 wherein the address recycling block includes a plurality of multiplexers coupled in parallel between the first and second inputs and the outputs of the address recycling block.

15. The integrated circuit as defined in claim 13 wherein the address signals are coupled to the first inputs of the address recycling block through programmable multiplexers and driver circuits.

16. The integrated circuit as defined in claim 13 wherein the integrated circuit is a field programmable gate array, and the address stall signal is generated by a programmable logic block.

17. The integrated circuit as defined in claim 16 wherein field programmable gate array is part of a system that includes a processor and a memory unit.

18. The integrated circuit as defined in claim 13 wherein the integrated circuit operates the memory block as a cache memory.

19. The integrated circuit as defined in claim 13 wherein the memory block includes an array of SRAM memory cells, and the address decoder circuit block selects word lines in the SRAM array.

* * * * *